United States Patent
Sedlmeier

(10) Patent No.: US 7,352,572 B2
(45) Date of Patent: Apr. 1, 2008

(54) FIRE BLOCK MODULE

(75) Inventor: Peter Sedlmeier, München (DE)

(73) Assignee: Siemens Aktiengesellschaft, Munich (DE)

( * ) Notice: Subject to any disclaimer, the term of this patent is extended or adjusted under 35 U.S.C. 154(b) by 50 days.

(21) Appl. No.: 11/187,243

(22) Filed: Jul. 22, 2005

(65) Prior Publication Data
US 2006/0070335 A1 Apr. 6, 2006

(30) Foreign Application Priority Data
Jul. 23, 2004 (DE) .................. 10 2004 035 780

(51) Int. Cl.
H05K 7/20 (2006.01)
H05K 5/00 (2006.01)
(52) U.S. Cl. .................. 361/695; 361/689; 361/690; 361/694; 174/15.1; 174/16.1; 454/184
(58) Field of Classification Search ............... 361/695, 361/694, 690, 689, 688, 704, 724; 174/15.1, 174/15.2, 16.1; 454/184
See application file for complete search history.

(56) References Cited

U.S. PATENT DOCUMENTS

| 3,193,262 A * | 7/1965 | Huffman, Jr. et al. ...... 432/225 |
| 3,583,478 A * | 6/1971 | Fieni ........................... 165/178 |
| 4,403,648 A * | 9/1983 | Styok ........................... 165/76 |
| 4,756,361 A * | 7/1988 | Lesage ........................ 165/149 |
| 5,205,354 A * | 4/1993 | Lesage ........................ 165/173 |
| 5,226,235 A * | 7/1993 | Lesage .................. 29/890.047 |
| 6,101,768 A * | 8/2000 | Springstead et al. ....... 52/126.6 |
| 6,283,850 B1* | 9/2001 | Toshimitsu et al. ......... 454/184 |
| 6,342,004 B1* | 1/2002 | Lattimore et al. .......... 454/184 |
| 6,548,753 B1* | 4/2003 | Blackmon et al. ............ 174/50 |
| 6,597,571 B2* | 7/2003 | Kubota et al. .............. 361/695 |
| 2002/0139554 A1* | 10/2002 | Kubota et al. ................ 174/50 |
| 2002/0139954 A1* | 10/2002 | Kubota et al. ................ 174/50 |
| 2005/0126764 A1* | 6/2005 | Alinovi et al. ............. 165/119 |
| 2005/0150636 A1* | 7/2005 | Hongwu ................ 165/104.33 |
| 2006/0249058 A1* | 11/2006 | Moore et al. ............. 108/57.25 |

FOREIGN PATENT DOCUMENTS

| DE | 28 50 618 | 11/1978 |
| EP | 10 44 703 | 3/2000 |
| EP | 1044703 A2 * | 10/2000 |
| FR | 1 136 632 | 5/1957 |

* cited by examiner

Primary Examiner—Jayprakash Gandhi
Assistant Examiner—Anthony M Haughton
(74) Attorney, Agent, or Firm—Bell, Boyd & Lloyd LLP

(57) ABSTRACT

The fire block module includes a number of rectangular plate strips, arranged vertically and parallel to each other to form a grid layer. The grid layer is arranged horizontally in respect of the vertical direction of flame propagation occurring in the event of a fire, thus achieving good heat energy dissipation and preventing flame propagation.

11 Claims, 3 Drawing Sheets

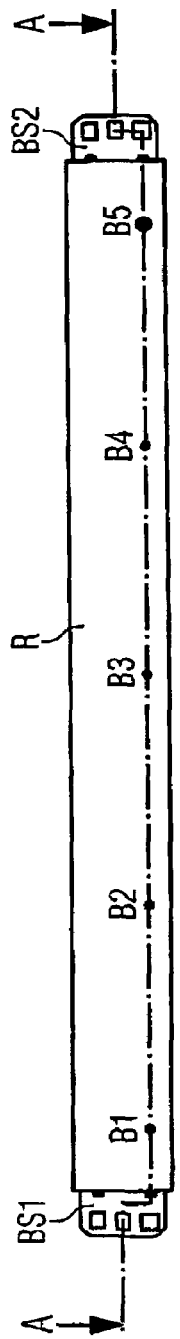
FIG 2
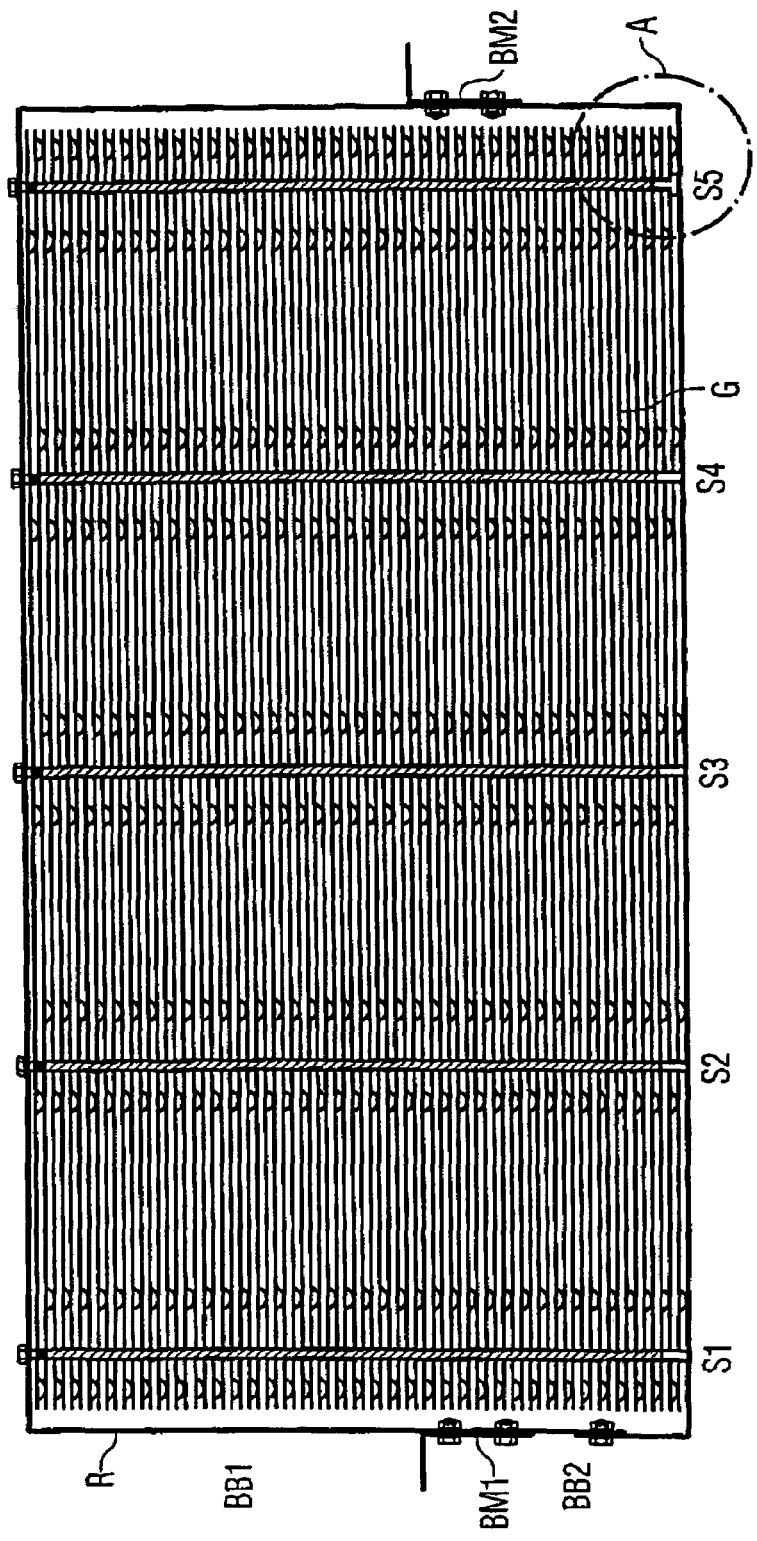
FIG 3  Schnitt A-A

FIRE BLOCK MODULE

CLAIM FOR PRIORITY

This application claims the benefit of priority to German Application No. 10 2004 035 780.3, filed Jul. 23, 2004.

TECHNICAL FIELD OF THE INVENTION

The invention relates to a fire block module, and in particular, which allows better heat energy dissipation for example within a module rack, so that the risk of a fire occurring or spreading is significantly reduced.

BACKGROUND OF THE INVENTION

In communication technology, specifically electrical or optical transmission technology, communication modules are used to process very large quantities of data. This causes the circuits arranged on the communication modules to become very hot. This effect is further heightened by the high density with which the circuits are arranged on such communication modules. The heat dissipation specifications for such communication modules therefore have to be very stringent. The dense arrangement of such communication modules means that fires can also result within a module holder. Other possible causes of fires are short circuits due to production or service errors and circuit overloads.

A number of module holders are generally integrated in one module rack that comprises two closed side walls, connected together by means of at least one upper and lower frame element and having at least one front door for example. To prevent heat building up within the respective module holder or subrack of the rack and fire resulting, fan units are provided in the module rack.

For module racks that comply with the requirements of the US standard NEBS for example such fan modules are integrated in both the base and the top surface of the module rack. Also—as already known from the German utility model document with the official reference DE 298 13 442 U1 for example—a fan module comprising a number of fans is provided on the top surface of a module holder, so that the heat energy resulting within the module holder can quickly be dissipated. Also a perforated plate slide-in module made of aluminum can for example be provided over the module holder, ensuring regular heat distribution within the module holder in the event of a fire.

SUMMARY OF THE INVENTION

The invention discloses a fire block module, which allows better heat energy dissipation for example within a module rack, so that the risk of a fire occurring or spreading is significantly reduced.

In one embodiment of the fire block module according to the invention, a fire block module comprises a number of rectangular plate strips and the plate strips are arranged vertically and parallel to each other to form a grid layer. The grid layer is arranged horizontally in respect of the vertical direction of flame propagation in the event of a fire. The configuration of the fire block module allows the heat energy of the flame that may result within a module rack for example to be dissipated quickly and effectively and to be emitted in a parallel fashion back to the throughflow of air so that the flowing gas fails to reach its ignition temperature after flowing through the fire block module and the gas does not therefore ignite. This significantly reduces the fire risk and any flames that result are specifically suppressed. In particular where there are a number of communication modules inserted from the front, a fire in one communication module arranged in a module holder, which is perpendicular to the grid structure, would initially produce a "wall of fire" that would be relatively narrow but would extend along the depth of the module holder. The fire block module advantageously dissipates the resulting heat energy along the shortest path or includes the flames of such a "wall of fire" with the aid of the plate strips of the fire block module that are arranged perpendicular to the wall of fire. Therefore the fire block module both improves dissipation of the heat energy resulting in the event of a fire and suppresses the development of flames.

BRIEF DESCRIPTION OF THE DRAWINGS

The invention is described in more detail below with reference to the attached figures based on an exemplary embodiments.

FIG. 2 shows an example of the front view of the fire block module.

FIG. 3 shows a cross-section A-A through the fire block module.

DETAILED DESCRIPTION OF THE INVENTION

Figure 1:
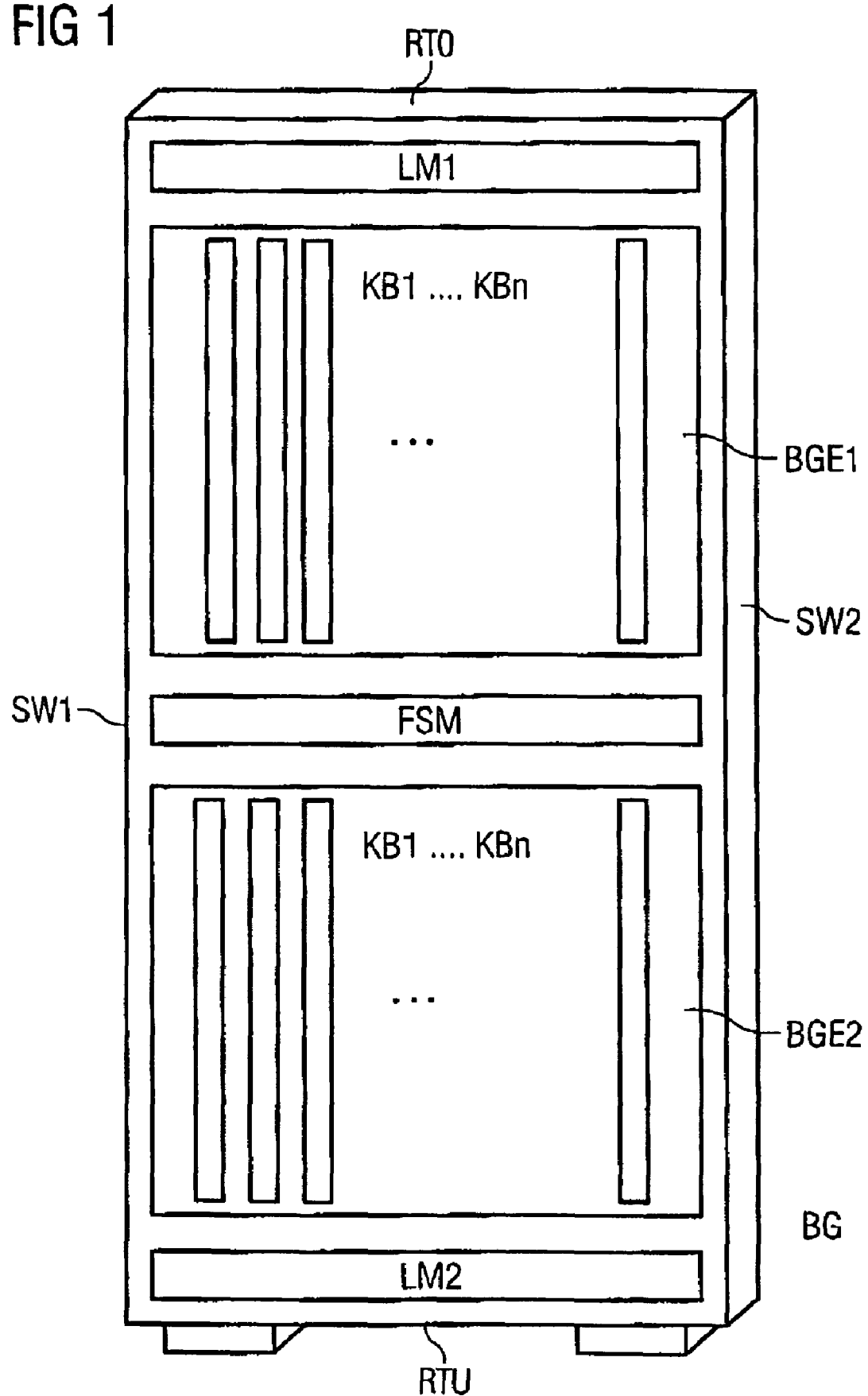
FIG. 1 shows an example of a front view of a module rack.

FIG. 1 shows a schematic diagram of an example of the front view of a module rack BG, having for example one fire block module FSM. The module rack BG also has a first and second side wall SW1, SW2, connected together by means of an upper and lower frame element RTU, RTO and forming a closed housing. The module rack BG can optionally have a rear wall and/or a rack front, which are not shown in FIG. 1. This ensures total protection against flames radiating from the module rack BG and protection against electromagnetic radiation.

The module rack BG also has a first fan module LM1 below the upper frame element RTO for example and a second fan module LM2 above the lower frame element RTU. A first module holder BGE1 is arranged between the first fan module LM1 and the fire block module FSM, having first to nth communication modules KBG1 to KBGn. The first to nth communication modules KBG1 to KBGn are arranged perpendicular to the first fan module LM1 and the fire block module FSM within the first module holder BGE1. A second module holder BGE2 is arranged between the fire block module FSM and the second fan module LM2 within the module rack BG, also having first to nth communication modules KBG1 to KBGn in the same way as the first module holder BGE1. If a fire occurs for example on the second communication module KB2 within the second module holder BGE2, the fire block module FSM prevents the spread of flames over or through from the second to the first module holder BGE2, BGE1.

FIG. 2 shows an example of a front view of the fire block module FSM, having a first and second attachment plate BS1, BS2 to attach the fire block module FSM for example within the module rack BG. Such attachment plates BS1, BS2 are necessary particularly if the fire block module FSM is configured as a removable slide-in module. Alternatively the fire block module can also be connected permanently for example to one of the module holders BGE1, BGE2 or the module rack BG. The fire block module FSM also has first to fifth holes B1 to B5, which are arranged at almost identical intervals along the longitudinal extension of the frame R of the fire block module FSM. The first to fifth holes B1 to B5 are provided to hold first to fifth connecting bars S1 to S5. FIG. 3 shows a cross-section through the fire block module along the line A-A shown schematically as a broken line in FIG. 1, which is intended to describe the structure of the fire block module FSM in more detail.

The fire block module FSM has a rectangular frame R, comprising a first and second stirrup-shaped component BB1, BB2, connected together by means of first and second attachment means BM1, BM2, for example screws or rivets. The first and second stirrup-shaped components BB1, BB2 of the frame R are also connected together by means of the first to fifth connecting bars S1 to S5. The frame R encloses a number of rectangular plate strips BS, which are arranged vertically and parallel to each other to form a grid layer G. The rectangular plate strips BS hereby have at least two, in the present exemplary embodiment first to fifth holes B1 to B5, through which one of the first to fifth connecting bars S1 to S5 is passed respectively to mount the rectangular plate strips BS, the plate strips BS being fixed for example by means of the center connecting bar S3 and being positioned by the further connecting bars S1, S2, S4, S5 and can expand with individual movement in the event of different heat levels along the positioning points by means of the connecting bars. FIG. 3 shows a number of such rectangular plate strips BS, mounted on the first to fifth connecting bars S1 to S5 within the frame R to form the grid layer G.

Figure 4:
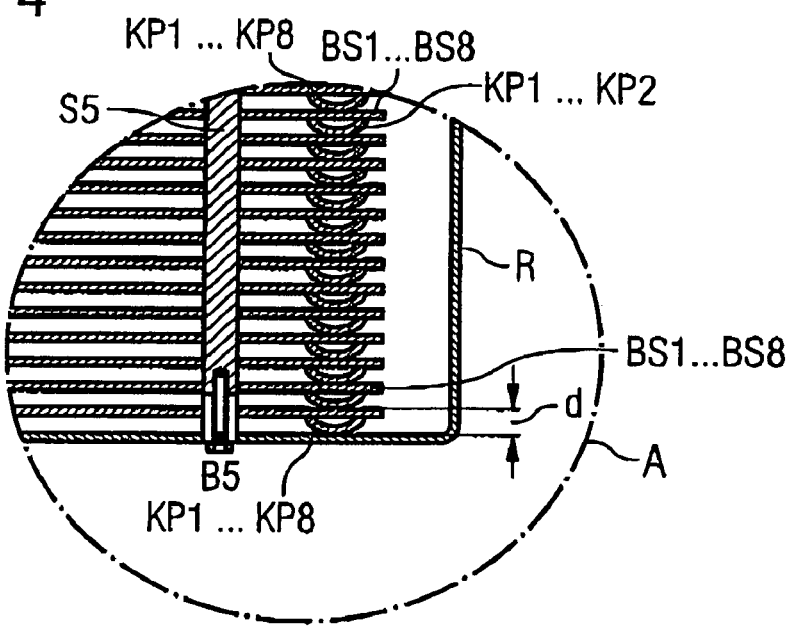
FIG. 4 shows an enlarged section of the grid layer of the fire block module.

To describe the structure of the grid layer G and the rectangular plate strips BS in more detail, a circular section A of the fire block module FSM shown in FIG. 3 is shown enlarged in the separate FIG. 4. FIG. 4 shows an enlarged section of the lower right-hand corner of the fire block module FSM shown in FIG. 3. FIG. 4 shows part of the frame R and the fifth hole B5 provided in the second stirrup-shaped component BB2, by means of which the fifth connecting bar S5 is connected to the frame R. First to eighth rectangular plate strips BS1 to BS8 are mounted on the fifth connecting bar S5, at identical intervals d within the grid layer G formed when they are mounted. The interval d is predefined by means of at least two first to eighth contact points KP1 to KP8 respectively that are punched out of the material, i.e. these predefine the interval d between the first to eighth plate strips BS1 to BS8 arranged parallel to each other within the grid layer G of the fire block module FSM. FIG. 4 by way of example shows only the first, third, fifth and seventh contact points KP1, KP3, KP 5, KP7, as the second, fourth, sixth and eighth contact points KP2, KP4, KP6, KP8 are arranged in an area to the left of the fifth connecting bar S5, i.e. in an alternating fashion, which cannot be seen because it is masked out in FIG. 4. The first to eighth contact points KP1 to KP8 can alternatively be arranged on the first to eighth plate strips BS, with both being made of the same material, to achieve a regular heat expansion coefficient.

Figure 5:
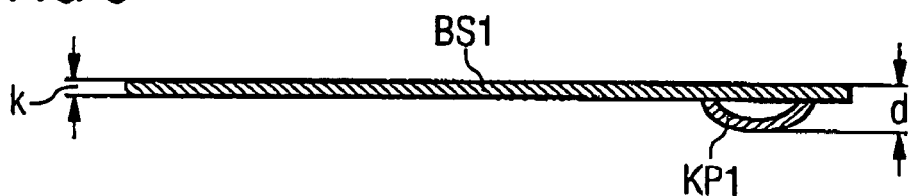
FIG. 5 shows an example of a section of a plate strip.
Figure 6:
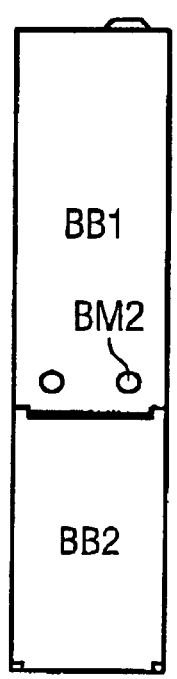
FIG. 6 shows an example of a side view of the fire block module.

FIG. 5 shows an example of a section of the first plate strip BS1, having a first contact point KP1 stamped out of the material and defining the interval d. Such plate strips BS are made of a material having a high heat conduction coefficient, e.g. aluminum. The plate strips BS have a thickness k of 0.5 to 3 mm and are arranged parallel to each other at an interval of 2 to 5 mm. The plate strips BS also have a width of approx. 20 to 60 mm and their length extends almost over the entire width of the frame R, i.e. over the width of the module rack BG. A plate strip BS therefore has a length of approx. 500 to 700 mm for example.

Finally FIG. 5 shows an example of a side view of the fire block module FSM, showing the first and second stirrup-shaped components BB1, BB2 of the frame R and the second attachment means BM2.

When using the fire block module FSM shown in FIGS. 2 to 6 within a module rack BG, a fire block module FSM is provided between at least two module holders BGE1, BGE2, extending over the entire width and at least part of the depth of the module holder BG, as in FIG. 1. The plate strips BS of such a fire block module FSM are hereby arranged perpendicular to the communication modules KB1 to KBN inserted within the module holders BGE1, BGE2. Also at least one fire block module FSM is provided alone or in combination with a fan module LM1, LM2 between two module holders BGE1, BGE2 respectively, the fire block module FSM hereby being configured as a removable slide-in module. The grid layer G, i.e. the plate strips BS, is thus arranged horizontally in respect of the vertical direction of flame propagation occurring in the event of a fire, to dissipate the heat energy occurring due to the fire along the shortest path. In the present exemplary embodiment, as in FIG. 1, the direction of flame propagation along the communication modules KB1 to KBn is perpendicular to the horizontally arranged fire block module FSM. The grid layer G, which has for example intervals of approx. 4 mm between the plate strips BS, provides a large heat-conducting mass, which allows both very effective heat dissipation and a reduction in flame propagation of between 30 and 50%. Significant factors here are the identical heat expansion coefficient of the materials and the "floating" arrangement of the plate strips BS within the frame R, ensuring the same interval between the rectangular plate strips BS even if the plate strips BS of the grid layer G expand to different degrees. An interval d of 4 mm and a material thickness k of 1 mm are particularly preferred.

What is claimed is:

1. A fire block module, comprising:
    a plurality of rectangular plate strips having a thickness of about 0.5 mm to about 3 mm and a width of about 20 mm to about 60 mm,
    the plate strips arranged vertically and parallel to each other to form a grid layer with the interval between the plate strips being approximately between 2 mm and 5 mm and the plate strips being connected together by connecting bars in a freely movable fashion within a rectangular frame enclosing the plate strips,
    wherein the grid layer is arranged horizontally with respect to the vertical direction of flame propagation occurring in an event of a fire.

2. The fire block module according to claim 1, wherein the plate strips are at identical intervals within the grid layer.

3. The fire block module according to claim 1, wherein the plate strips are made of a material with good heat conductivity.

4. The fire block module according to claim 1, wherein the plate strips of the fire block module each have at least two contact points punched out of the material, which predefine the interval between parallel plate strips within the fire block module.

5. The fire block module according to claim 1, wherein the plate strips have at least two holes, through which the connecting bars is passed respectively to mount the plate strips, the plate strips being connected together by the connecting bars in a freely movable fashion.

6. The fire block module according to claim 1, wherein at least one of the connecting bars is connected permanently to the rectangular frame.

7. A module rack with at least one fire block module including a plurality of rectangular plate strips, the plate strips arranged vertically and parallel to each other to form a grid layer, wherein the plate strips being connected together by connecting bars in a freely movable fashion within a rectangular frame enclosing the plate strips and wherein the grid layer is arranged horizontally with respect to the vertical direction of flame propagation occurring in an event of a fire, comprising:

two side walls, connected together by at least one lower frame element and at least one upper frame element; and module holders to hold communication modules, wherein the at least one fire block module extends over an entire width and at least part of a depth of a module rack, which is provided between the module holders, wherein the plate strips have a thickness of about 0.5 mm to about 3 mm and a width of about 20 mm to about 60 mm and wherein the interval between the plate strips is approximately between 2 and 5 mm.

8. The module rack according to claim 7, wherein the plate strips of the fire block module are arranged perpendicular to the communication modules inserted within the module unit.

9. The module rack according to claim 7, wherein a slide-in fire block module is provided between the module holders respectively within the module rack (BG).

10. The module rack according to claim 7, wherein the fire block module is configured as a removable slide-in module.

11. The module rack according to claim 7, wherein at least one fan module is provided within the module rack in addition to the fire block module.

* * * * *